United States Patent [19]
Stan et al.

[11] Patent Number: 5,723,880
[45] Date of Patent: Mar. 3, 1998

[54] THIN FILM 2H α-SIC

[75] Inventors: Mark Anthony Stan, Westlake; Martin Owen Patton, Fairview Park; Joseph Dale Warner, Westlake, all of Ohio

[73] Assignee: Kent State University, Kent, Ohio

[21] Appl. No.: 484,761

[22] Filed: Jun. 7, 1995

Related U.S. Application Data

[62] Division of Ser. No. 210,044, Mar. 17, 1994, Pat. No. 5,529,949.

[51] Int. Cl.$^6$ .................................................. H01L 31/0312
[52] U.S. Cl. ........................................... 257/77; 257/705
[58] Field of Search ................................. 257/705, 701, 257/703, 702, 77

[56] References Cited

U.S. PATENT DOCUMENTS

| | | |
|---|---|---|
| 4,517,305 | 5/1985 | Suzuki et al. . |
| 5,043,773 | 8/1991 | Precht et al. ............................. 257/77 |
| 5,080,753 | 1/1992 | Doll et al. . |
| 5,281,831 | 1/1994 | Uemoto et al. . |
| 5,319,220 | 6/1994 | Suzuki et al. ............................. 257/77 |
| 5,380,511 | 1/1995 | Arahori et al. . |

OTHER PUBLICATIONS

Thin Film Deposition and Microelectronic and Optoelectronic Device Fabrication and Characterization in Monocrystalline Alpha and Beta Silicon Carbide, Robert F. Davis et al., invited paper, Proceedings of the IEEE, vol. 79, No. 5, May 1991.

Crystal Growth of 2H Silicon Carbide, J. Anthony Power, Journal of Applied of Physics, vol. 40, No. 11, pp. 4660–4662, Oct. 1969.

Growth of Thin Films by Laser-Induced Evaporation, Jeffrey T. Cheung and Haluk Sankur, CRC Critical Reviews in Solid State and Materials Sciences, vol. 15, Issue 1 (1988), pp. 64–109.

Recent development in SiC single–crystal electronics, P.A. Ivanov and V.E. Chelnokov, Semiconductor Science Technology, vol. 7, pp. 863–880, 1992.

Hetro–Expitaxial composition: Rare polytype of silicon carbide 2H on insulating substrate of aluminium nitrade–sapphire, Translated by Gregory Adamsky, pp. 1–3.

Growth of 2H–SiC on 6H–SiC by Pulsed Laser Ablation, M.A. Stan, M.O. Patton, J.D. Warner, NASA Lewis Research, Center, Cleveland, Ohio 44135, J.W. Yang and P. Pirouz, Department of Materials Science and Engineering, Case Western Reserve University, Cleveland, Ohio 44106, pp. 1–8. (May 16, 1994).

Growth, Luminescence, Selection Rules, and Lattice Sums of SiC with Wurtzite Structure, Lyle Patrick, D.R. Hamilton and W.J. Choyke, Westinghouse Reserach Laboratories, Pittsburgh, Pennsylvania (Received 21 Oct. 1965) pp. 526–536.

The Potential of Diamond and SiC Electronic Devices for Microwave and Millimeter–Wave Power Applications, Robert J. Trew, Fellow, Ieee, Jing–Bang Yan, Member, IEEE, and Philip M. Mock, Member, IEEE, pp. 598–660.

A Novel L–Coupled RF PECVD System for Large–Area Deposition of a–SiC:H for Device Applications, A. Tran, D. Fung, M.M. Rahman, and C.Y. Yang, Microelectronics Laboratory, Santa Clara University, CA 95053, USA, pp. 83–87.

Recent Progress in Epitaxial Growth of SiC, H. Matsunami, Department of Electrical Engineering, Kyoto University, Yoshidahnomachi, Sakyo, Kyoto 606, Japan, pp. 3–12.

Recent Developments in SiC (USA), J.A. Powell and L.G. Matus, NASA Lewis Research Center, Cleveland, Ohio 44135, USA, pp. 2–12.

Synthesis and erystallography of the wurtzite form of silicon carbide, By Robert F. Adamsky and Kenneth M. Merz, Research and Development Division, The Carborundum Company, Niagra Falls, New York, With 2 Figures, (Received Jan. 13, 1959), pp. 351–361.

Growth of Thin Films by Laser–Induced Evaporation, vol. 15, Issue 1 (1988), By: Jeffrey T. Cheung, Department of Electronic Imaging, Science Center, Rockwell International, Thousand Oaks, California and Haluk Sankur, Department of Applied Optics, Science Center, Rockwell International, Thousand Oaks, California, pp. 63–109.

Dialog Search for Process for Fabricating Sic Semiconunctor Devices, Patent No. 3,956,032.

Preparation of oriented silicon carbide films by laser ablation of ceramic silicon carbide targets. L. Rimai, R. Ager, E. Logothetis, W.H. Weber, J. Hangas; Ford Motor Company Research Staff, Dearborn MI; (Aug. 28, 1991).

Investigation of the Growth of 3C–SiC and 6H–SiC Films on Low–Tilt–Angle Vicinal (0001) 6H–SiC Wafers; J.A. Powell, D.J. Larkin, J.B. Petit, J.H. Edgar; NASA Lewis Research Center, Cleveland, Ohio; (pp. 23–30).

MBE Growth of 3C–SiC/6H–SiC and The Electric Properties of ITS p–n Junction; Shigeo Kaneda, Yoshiki Sakamoto, Tadashi Mihara, Takao Tanaka; Technological University of Nagooka, Kamitamioka, Nagooka, Japan; Journal of Crystal Growth 81 (1987) (pp. 536–542).

*Primary Examiner*—Mahshid D. Saadat
*Assistant Examiner*—S. V. Clark
*Attorney, Agent, or Firm*—Calfee, Halter & Griswold LLP; Carmen R. Adams; Jeanne E. Longmuir

[57] ABSTRACT

Thin films of 2H α-silicon carbide are produced by pulsed laser ablation.

2 Claims, No Drawings

THIN FILM 2H α-SIC

This is a division of application Ser. No. 08/210,044, filed Mar. 17, 1994, now U.S. Pat. No. 5,529,949.

This invention was made with Government support under contract NCC3-222 awarded by NASA. The Government has certain rights to this invention.

BACKGROUND OF THE INVENTION

Crystalline silicon carbide exists in two basic forms, α-silicon carbide and β-silicon carbide. In β-silicon carbide, the crystals are cubic in nature. In α-silicon carbide, the crystals are rhombohedral or comprise stacked hexagonal layers. See Davis et al., Thin Film Deposition and Microelectronic and Optoelectronic Device Fabrication and Characterization in Monocrystalline Alpha and Beta Silicon Carbide, invited paper, Proceedings of the IEEE, Vol. 79, No. 5, May 1991.

There are over 100 different types (known as polytypes) of α-silicon carbide. The most common is 6H α-silicon carbide, which has a crystal structure in which six Si-C double sheets or layers are stacked atop one another to form a single lattice cell. Another form of α-silicon carbide which has been recently developed is 2H α-silicon carbide. In this material, the crystal structure is characterized in only two layers of Si-C double sheets being stacked atop of one another to form the lattice unit.

Silicon carbide exhibits a number of interesting properties. It has a large band-gap, high thermal conductivity, good radiation resistance, reasonable charge carrier mobilities, and excellent chemical and physical stability at temperatures in excess of 1,000° C. For this reason, it has been proposed to use silicon carbide in a wide variety of different applications, including optical applications such as in the formation of optical coatings and the like. To date, however, use of silicon carbide for such utilities has been limited because of the inability to grow thin films from this material.

Recently, however, a number of techniques have been successfully used to produce silicon carbide in the form of thin films. Various deposition techniques, such as vapor phase epitaxy and molecular beam epitaxy, have been used for this purpose.

Unfortunately, none of these techniques has been able to produce 2H α-silicon carbide in thin film form. Molecular beam epitaxy produces β-silicon carbide and amorphous silicon carbide, while vapor phase epitaxy and other chemical vapor deposition techniques produce poly-types other than 2H α-silicon carbide. Techniques currently known for producing 2H α-silicon carbide such as, for example, chemical vapor deposition using a mixture of hydrogen with methyltrichlorosilane ($CH_3SiCl_3$) as reactants, uniformly produce small cylindrical crystals as product. See Ivanov et al., Recent development in SiC single-crystal electronics, Semiconductor Science Technology, Vol. 7, pp. 863–880, 1992; and Powell, Crystal Growth of 2H Silicon Carbide, Journal of Applied of Physics, Vol. 40, No. 11, pp. 4660–4662, October 1969.

Accordingly, it is an object of the present invention to provide a technique for forming thin films of 2H α-silicon carbide as well as the thin films so produced.

SUMMARY OF THE INVENTION

This and other objects are accomplished by the present invention in accordance with which it has been discovered that thin films of 2H α-silicon carbide can be produced by pulsed laser ablation.

DETAILED DESCRIPTION

In accordance with the present invention, thin films of 2H α-silicon carbide are produced by pulsed laser ablation. By "thin film" is meant a layer having two major surfaces which are separated by a dimension, the thickness, which is less than the other two orthogonally arranged dimensions, i.e., the length and the width. In other words, the thickness of the layer is smaller than its diameter measured in any direction perpendicular to the thickness. Thin films of significant size have diameters of at least five, preferably at least ten, times their thickness.

Pulsed laser ablation is a known technique for vapor depositing various materials on substrates. Basically, the technique involves bombarding the surface of a target with pulses of high energy density laser light so that individual atoms of the target are physically blasted off the surface of the target to form a cloud or volume of the atoms so removed. Because the energy of the laser pulses is so high, at least some of the atoms removed from the target surface are ionized as well and with initial temperature at least an order of magnitude higher than that of the substrate, thereby making the vapor or cloud a "high energy plasma". To carry out coating, a target is arranged so that the species of the plasma, i.e. the atoms, ions and electrons forming the plasma, impinge upon the surface of the substrate to be coated. As a result, a layer of these species, typically in the form of reaction products of these species, forms on the substrate. See, for example, J. T. Cheung and H. Sankur, Growth of Thin Films by Laser Induced Evaporation, CRC Critical Reviews in Solid State and Materials Sciences, Vol. 15, Issue 1, 1988.

In the inventive process, pulsed laser ablation is used to create a high energy plasma of carbon and silicon which is then directed onto a substrate. In accordance with the present invention, it has been found that α-silicon carbide will grow epitaxially, in the form of a layer, on a suitably selected substrate and further that this α-silicon carbide layer will be composed of 2H α-silicon carbide, not the α-silicon carbide, β-silicon carbide and amorphous silicon carbide which have been formed using other known techniques. Accordingly, it is possible in accordance with the present invention to provide thin layers of 2H α-silicon carbide in a simple and straightforward manner.

In producing 2H α-silicon carbide with laser ablation in accordance with the present invention, it is necessary to use a target for laser light bombardment which will produce a high energy plasma of silicon and carbon. This is most easily done using silicon carbide as the target. Any form of silicon carbide can be used for this purpose, since all forms of silicon carbide have the same ratio of silicon and carbon.

Silicon and carbon individually, can also be used. For example, solid silicon and carbon in any form can be used. Of course, two separate lasers, or one laser plus suitable manipulating means for exposing each of the different targets to laser bombardment of suitable duration, would need to be used. An advantage of using silicon and carbon individually as targets is that the molar ratio of carbon to silicon in the high energy plasma can be adjusted to account for the difference in the "sticking" coefficient (i.e., the probability that a molecule which lands on the substrate will remain attached) between silicon and carbon.

Basically, the target to be used in accordance with the present invention can be any material which will allow formation of a high energy plasma of silicon and carbon atoms, i.e., a plasma in which at least some of the atoms therein are ionized. However, there is a process to make silicon carbide by a low energy plasma. That process is known as plasma enhanced chemical vapor deposition. In this case, the plasma species consists of radicals such as —$CH_3^+$, —$SiH_3^+$, and the like. In this process, the —$CH_3^+$, —$SiH_3^+$ or like species undergo chemical reaction at the low temperature substrate surface to form amorphous silicon carbide. These techniques are completely different from the present invention in which the plasma contains atomic silicon, atomic carbon and ionized species thereof, which combine on a substrate to form 2H α-silicon carbide.

The identity, size and mode of operation of the laser used in accordance with the present invention is not critical. Rather, any laser which will generate a high energy plasma of silicon and carbon atoms as described above can be used. With current technology, this means that the laser will be a pulsed laser, that is a laser which periodically fires discrete pulses of laser light at its target. As new lasers are developed, they can also be used provided that they can generate a high energy plasma of silicon and carbon atoms as described above.

An example of a laser found to be particularly suitable for carrying out the present invention is a Lumonics Hyper EX-460 excimer laser using krypton and fluorine as the lasing gases to produce laser light at 248 nanometers wavelength. Operating this laser at two pulses per second to provide an energy density of about 2.5 Joules per square centimeter (per pulse) has been found to be particularly suitable. Under these conditions, the laser pulses last about 20 nanoseconds, with the total amount of laser energy being generated being on the order of 2,000 Joules per hour.

Other operating conditions can be employed. For example, the energy density can be varied from about 0.5 to 10 Joules per square centimeters per pulse with pulses lasting from as little as 0.1 or less nanoseconds to as many as 30 or more nanoseconds.

Entirely different pulsed lasers can also be used. In this connection, it is well known by those skilled in the art of pulsed laser ablation that the ability of a pulsed laser to generate plasma from a particular target depends on a number of operating variables including pulse duration, wavelength of the laser, energy density and so forth. In accordance with the present invention, different lasers operating at different conditions can be employed, so long as the net result is to produce a plasma of silicon and carbon.

Deposition techniques using pulsed laser ablation are carried out under vacuum. The exact pressure of the vacuum used in the pulsed laser ablation process of the present invention is not critical, although the pressure should be low enough to allow enough plasma to form and transfer from the target to the substrate in a reasonable amount of time. Usually, this means that the mean free path of the plasma species (i.e., the atomic and ionic carbon and silicon atoms) should be on the order of the spacing between the target and the substrate, although this is not necessary. Also, there is no minimum pressure insofar as the inventive process is concerned, the minimum pressure in practice being determined by the equipment. Typically, pressures on the order of $10^{-5}$ to $10^{-10}$, preferably $10^{-6}$ to $10^{-9}$, Torr are useful. Also, if desired, a small amount of molecular oxygen may be included in the system, since there are some indications in the prior art that this is beneficial in forming 2H α-silicon carbide in bulk.

Pulsed laser ablation is also typically carried out at elevated substrate temperatures. As appreciated by those skilled in the art, the existence and stability of different polytypes of α-silicon carbide is temperature dependent. If the temperature is too high, other forms of crystalline silicon carbide, e.g., 4H α-silicon carbide, 6H α-silicon carbide and β-silicon carbide, may form. If the temperature is too low, amorphous silicon carbide may form. Accordingly, the exact temperature to use in a particular application of the inventive process should be determined by routine experimentation depending on the laser type and manner of operation, the pressure of the system and other variables. When using a krypton/fluorine eximer laser as described above, substrate holder temperatures on the order of 600° C. to 1800° C., more preferably 1250° C. to 1650° C., are suitable.

Another significant variable in thin film epitaxy from atomic plasmas is deposition rate. As is well appreciated by those skilled in the art, the rate at which the coating deposits in this type of process depends to some extent on the temperature of the substrate as well as the pressure of the system, i.e., the degree of vacuum. Primarily, however, it is dependent on the operation of the laser, faster ablation of the target causing faster deposition of the target crystal on the substrate surface. In accordance with the present invention, there is no known upper or lower limit to the deposition rates that can be used to produce 2H α-silicon carbide. The maximum deposition rate is limited as a practical matter by the amount of energy that can be imparted to the target per unit time, while the minimum is dependent as a practical matter on constraints of time. With today's equipment, deposition rates of as much as 100 Angstroms per second are known with comparable materials. Such rates are also useful in the present invention. At deposition rates lower than 0.01 Angstroms per second, the rate is so low that it is impractical purely as a matter of time. Deposition rates this low can be used in accordance with the present invention, but as a practical matter higher deposition rates should be employed. In the laboratory, deposition rates on the order of 0.25 Angstroms per second have been found suitable, although in actual practice any suitable deposition rate can be employed.

As is well appreciated by those skilled in the art of thin film epitaxy, an important aspect of any epitaxial growth process is the identity and preparation of the substrate surface on which the epitaxial layer is to be grown ("growth surface"). In order to get the deposited layer to grow epitaxially, the substrate used is typically one whose growth surface registers or nearly registers with that of the material to be grown. By "registers" is meant that the pattern of atoms at the growth surface of the substrate allows or promotes the arrangement of the first layer of growth in the desired crystallographic arrangement. Most commonly, the growth surface will exhibit a pattern of atoms having the same structure and arrangement as the crystalline film being grown. In such case, the growth surface is said to "match" the product crystal. For example, where the substrate in the inventive process is α-silicon carbide arranged so that the basal plane thereof is presented for crystal growth, this surface will "match" exactly the basal plane of the 2H α-silicon carbide product to be grown.

However, as is well appreciated by those skilled in the art of epitaxy, the growth surfaces need not always match a plane of the crystal to be grown. In some cases growth surfaces whose atoms are in the same arrangement as a plane of the crystal to be grown, but whose atomic spacings are multiples or rational fractions of the atomic spacings of that material, may result in epitaxy. In this case, a plane of the material being grown is said to "register" with the growth surface, and in accordance with the invention a substrate whose growth surface is in substantial registration with the basal plane of 2H α-silicon carbide can also be used.

As is also well appreciated by those skilled in the art of epitaxy, it is often possible to grow a thin film whose crystal orientation differs from that of the substrate surface. For example, a thin film with a (110) orientation can be grown on a substrate with a (100) orientation of the surface. This practice is also in accordance with the present invention.

Preferably, however, the substrate used in the inventive process is one in which the growth surface matches or nearly matches the basal plane of 2H α-silicon carbide. For example, since the basal plane of lattice structure of 2H α-silicon carbide is composed of hexagonally arranged atoms whose lattice parameter, "a," is 3.076 Angstroms, the material chosen for the substrate is preferably one whose growth surface also has a hexagonal arrangement of atoms with a lattice parameter of approximately 3.076 Angstroms.

Since all polytypes of silicon carbide (including 2H α-silicon carbide) have the same basal plane, all polytypes of silicon carbide are preferred for use as substrates in the inventive process. 6H α-silicon carbide has been found to be particularly suitable. Other materials which are also suitable are aluminum nitride, 4H silicon carbide, 3C silicon carbide and aluminum nitride-silicon carbide mixtures, solutions or alloys.

Selecting suitable substrates for epitaxial growth of vapor deposited materials is well known to those skilled in the art, and any material which will provide the necessary surface structure and chemical compatibility for epitaxial growth can be used. As is appreciated by those skilled in the art, the number of crystallographic defects that will be introduced into an epitaxially grown layer increases as the difference between the lattice parameter of the substrate and that of the material being grown increases. Accordingly, the properties of the substrate should be selected so that in growing the 2H α-silicon carbide product layer, defects are limited to an acceptable level.

As is also appreciated by those skilled in the art of thin film epitaxy, surface preparation of the substrate can play a role in the ultimate results obtained. In this regard, it has been found in other thin film epitaxy processes such as CVD that the results obtained can be improved by preparing the substrate so that the growth surface, i.e., the surface presented for epitaxial growth, is at a slight angle, e.g., 3° or less, with respect to the surface plane of the crystal lattice of the substrate. Accordingly, in practicing the present invention, the substrate may also be prepared so as to present its deposition surface at an angle to the basal plane, although this is not necessary.

As is also well appreciated by those skilled in the art, substrates must be free of contamination before use. Degreasing has been accomplished with an acetone and a methanol dip. Native oxides can then be removed by an acid or base dip. A hydrofluoric acid dip has been employed in the case of 6H silicon carbide substrates.

2H α-silicon carbide thin films can be produced to any desired thickness in accordance with the present invention. As in any epitaxial growth process, there is a practical limit on the maximum thickness of the films produced which is dependent, among other things, on the vapor deposition apparatus employed. In accordance with the present invention, other than these practical well known limits, there is no constraint on the maximum or minimum thickness of the thin films produced.

2H α-silicon carbide thin films produced in accordance with the present invention can be used for a wide variety of applications. For example, they are particularly suitable for forming optical coatings on various optical devices. Since they are one of the hardest materials known to man as well as chemically inert and radiation hard (i.e. extremely resistant to degradation from most all types of radiation), they are ideally suited for forming protective coatings on various optical devices. Because they also exhibit a high index of refraction, they also enable adjustment of the optical properties of various optical devices in addition to providing excellent protection against shock, impact, chemicals and radiation.

The 2H α-silicon carbide thin films of the present invention can also be used in other areas as well. For example, because of their extreme hardness, they can be used in micromachining, i.e., they can be used to provide the cutting edge of a microknife, for example. Because of their extremely durable and tough physical properties, they can also be used, for example, as a heat sink for supporting and carrying the sensing element of a bolometer. A bolometer is a radiation detector for detecting radiation in the infrared to submillimeter wavelength range. Other utilities are also appropriate. For example, they can also be used to form electronic devices, such as diodes, light emitting diodes, UV photo-diodes, and transistors.

Another feature of the present invention is the production of large area crystalline films of 2H α-silicon carbide. Preferred large area crystalline films contain crystals measuring at least 1000 Angstroms in diameter, preferably at least 10,000 Angstroms, and production of single crystal films having diameters of one centimeter and even more are contemplated by the present invention. These films can have thicknesses ranging from 5 Angstroms to greater than 1 millimeter in thickness. More typical are thickness of 0.05 to 1 micron.

In the art of thin film epitaxy from atomic plasmas, it is well known that certain conditions promote the growth of large single crystals. In particular, it is known that in these crystal growing processes (1) increasing the substrate temperature and (2) increasing cleanliness promote the growth of larger single crystals, while (3) selection of appropriate deposition rates can also play a significant role in the size of the single crystals grown.

In the working examples shown below, the thin film produced in Example 3 was composed of single crystals, measuring approximately 150 Angstroms in diameter. In Example 5, the thin film was composed of single crystals measuring approximately 650 Angstroms in diameter. Thus, it can be seen that the specific conditions employed in the inventive process, for example, temperature have an effect on the size of the single crystals produced. Accordingly, it is possible in accordance with the present invention by suitable adjustment of the conditions known to affect single crystal size to produce single crystals of the desired "large" size.

For example, in order to produce large 2H α-silicon carbide single crystals in accordance with the present invention, it is desirable to start with a substrate which is atomically clean. Typically, this can be done by heating the substrate in vacuum to a high enough temperature, for example 800° C. to 1000° C., to drive off all oils and unwanted oxides from the growth surface in a clean vacuum. To determine if the growth surface is atomically clean, the surface can be analyzed by RHEED (Reflective High Energy Electron Diffraction) in a known manner. If the substrate is not atomically clean, the growth surface can be heated again and/or it can also be bombarded with low energy ions or glancing angle ions (2° to 3°) with an ion gun followed by annealing at a high temperature to remove any damage to the surface from the bombardment. Such cleaning techniques are well known to those skilled in the art and produce a growth surface which is atomically clean.

The exact conditions of substrate temperature, surface cleanliness and deposition rate needed to foster growth of large single crystals will vary depending upon the particular conditions employed in the deposition process including type of substrate, impurity level of substrate, type of laser, temperature, pressure, operating conditions of the laser and so forth. Accordingly, for each particular instance of carrying out the inventive process, routine experimentation can be used to determine the exact value for each of these variables including substrate temperature, the exact degree of cleanliness and the exact deposition rate that are necessary to produce the desired large single crystals. This can be easily done by a person of ordinary skill in this art.

Large single crystals of 2H α-SiC in the present invention find particular use as electronic devices, particularly semiconductor devices such as field effect transistors, diodes and the like. In this utility, the inventive single crystals are used in the same way as prior art single crystals used in electronic devices. For example, they are mounted on, and/or provided with means for attaching to, electrical conductors so they can be electrically attached to other components. In view of the excellent chemical stability, physical stability at high temperature and good radiation resistance of 2H α-silicon carbide, electronic devices made from this material are particularly advantageous in environments where extreme conditions are to be encountered.

WORKING EXAMPLE

In order to more thoroughly illustrate the present invention, the following working examples were conducted.

A series of substrate blanks measuring 4×4 millimeters were prepared for vapor deposition by degreasing and cleaning by rinsing with acetone followed by cleaning with methanol. They are then dipped in a solution of hydrofluoric acid to remove native oxides. Some of the substrate blanks were composed of silicon, while others were composed of 6H silicon carbide (0001). The so-prepared substrates were then placed on the substrate holder of a vacuum deposition chamber. The deposition plate of the device was composed of a molybdenum plate, and the substrates were mounted thereon using molybdenum spring clips. A type "R" thermocouple was spot welded to the plate for temperature measurement. The molybdenum deposition plate was arranged parallel to and approximately 5 to 6 centimeters away from the target. In each experiment, a high purity (99.999%) polycrystalline SiC wafer produced by CVD was also placed into the vacuum deposition chamber as the target.

Each target was illuminated with radiation of wavelength 248 nm from a Lumonics Hyper EX-460 excimer laser at energy density of about 2.5 J/cm$^2$ and a repetition rate of 2 pulses per second, resulting in a deposition rate of about 0.5 Angstroms per second. The substrate holder temperatures used in these experiments ranged from 960° C. to 1270° C.

In order to determine if 2H α-silicon carbide was produced, the samples were subjected to the following analytical testing regimen. Initially, all the samples were analyzed with both optical and scanning electron microscopy. No results were obtained since these techniques were not sensitive enough. Next, samples were subjected to x-ray diffraction to determine if the products were crystalline. Then, the samples were subjected to atomic force microscopy (AFM) to determine if the hexagonal structure of 2H α-silicon carbide was obtained, thereby ruling out 3C β-silicon carbide. Next, transmission electron microscopy (TEM) was used to confirm if the hexagonal polytype was 2H α-silicon carbide. Finally, all of the samples were subjected to auger electron spectroscopy (AES) to determine their chemical compositions. The results obtained are set forth in the following table.

TABLE

| | REACTION PARAMETERS | | RESULTS | | | |
|---|---|---|---|---|---|---|
| Ex. | Substrate | Plate Temp. | X-ray Reflections | AFM Results | TEM Results | Auger Results |
| 1 | 6H-SiC | 960° C. | No peaks | Featureless | — | Si and C ratio the same as reference sample. Oxygen is detected in film. |
| 2 | Si | 960° C. | No peaks | Featureless | — | Si and C ratio the same as reference sample. Oxygen is detected in film. |
| 3 | 6H-SiC | 1125° C. | d = .252 nm corresponds to (0002) 2H-SiC planes | Hexagonal grains 15 nm wide and surface roughness of .45 nm | — | Si and C ratio the same as reference sample. Oxygen is detected in film. |
| 4 | Si | 1125° C. | No peaks | Featureless | — | Si and C ratio the same as reference sample. Oxygen is detected in film. |
| 5 | 6H-SiC | 1270° C. | d = .252 nm and d = .126 corresponds to (0002) 2H-SiC planes | Hexagonal grains 65 nm wide and surface roughness of 7.2 nm | Atomic imaging TEM clearly shows the 2H-SiC symmetry. Epitaxial growth on 6H-SiC. Electron diffraction patterns indexes to 2H-SiC. | The film and substrate found to be deficient in Si. Oxygen is present. |

From the above table, it can be seen that the films of Examples 1, 2 and 4 were featureless in the AFM results and exhibited no peaks in the XRD analysis. This indicated that the material formed in these examples was amorphous, not crystalline. In Examples 3 and 5, however, XRD shows d-spacing of 0.252 nanometers which corresponds to the spacing between silicon planes in silicon carbide. In addition, AFM shows hexagonal grains in both Examples, which is also indicative of α-silicon carbide. Also noteworthy is the fact that the individual grains produced at the higher temperature of Example 5 were significantly larger than those of Example 3 which were produced at a lower temperature. In any event, production of 2H α-silicon carbide was confirmed in Example 5 by TEM which clearly showed the 2H α-silicon carbide symmetry.

Although only a few embodiments of the present invention have been described above, it should be appreciated that many modifications can be made without departing from the spirit and scope of the invention. All such modifications are intended to be included within the scope of the present invention, which is to be limited only by the following claims.

We claim:

1. 2H α-silicon carbide in the form of a thin film, said thin film defining two major surfaces, said two major surfaces defining a thickness therebetween, and the diameter of said thin film in all directions perpendicular to said thickness being at least five times said thickness.

2. The article of claim 1 wherein said diameter is at least ten times said thickness.

* * * * *